(12) United States Patent
Stueber et al.

(10) Patent No.: US 10,697,911 B2
(45) Date of Patent: Jun. 30, 2020

(54) RAPID QUANTIFICATION OF COMPONENTS IN SOLID MIXTURES OF CHEMICALS VIA TIME-DOMAIN NMR SPECTROSCOPY

(71) Applicant: Bruker BioSpin Corp., Billerica, MA (US)

(72) Inventors: Dirk Stueber, Fanwood, NJ (US); Stefan Jehle, Binz (CH)

(*) Notice: Subject to any disclaimer, the term of this patent is extended or adjusted under 35 U.S.C. 154(b) by 148 days.

(21) Appl. No.: 16/072,629

(22) PCT Filed: Feb. 10, 2017

(86) PCT No.: PCT/US2017/017494
§ 371 (c)(1),
(2) Date: Jul. 25, 2018

(87) PCT Pub. No.: WO2017/139661
PCT Pub. Date: Aug. 17, 2017

(65) Prior Publication Data
US 2019/0033240 A1 Jan. 31, 2019

Related U.S. Application Data (60) Provisional application No. 62/294,375, filed on Feb. 12, 2016.

(51) Int. Cl.
*G01R 33/46* (2006.01)
*G01R 33/48* (2006.01)
*G01N 24/08* (2006.01)

(52) U.S. Cl.
CPC .......... *G01N 24/085* (2013.01); *G01N 24/08* (2013.01); *G01N 24/082* (2013.01);
(Continued)

(58) Field of Classification Search
CPC ............ G01R 33/4831; G01R 33/5617; G01R 33/5608; G01R 33/4822; G01R 33/482
(Continued)

(56) References Cited

U.S. PATENT DOCUMENTS 5,281,913 A 1/1994 Kaufman et al.
5,936,405 A * 8/1999 Prammer ............. G01N 24/081
324/303
(Continued)

FOREIGN PATENT DOCUMENTS

EP 2166369 A2 3/2010

OTHER PUBLICATIONS

Blümich, B., 2006. Miniature and tabletop nuclear magnetic resonance spectrometers. Encyclopedia of Analytical Chemistry: Applications, Theory and Instrumentation, pp. 1-31. (Year: 2006).*
(Continued)

*Primary Examiner* — Christopher P McAndrew
(74) *Attorney, Agent, or Firm* — Benoit & Côté Inc.

(57) ABSTRACT

There is described a method for determining the relative quantities of the expected components in a multi-component mixture of solids. The proposed quantification method makes use of a time domain nuclear magnetic resonance (TD-NMR) spectrometer and requires that, for each of the expected components in the mixture, a T1 saturation recovery curve (SRCi) is measured and recorded. The saturation recovery curve for the mixture sample (SRCmix) is determined from a measurement of the sample with the spectrometer. The relative amounts of the expected components present in the mixture sample are determined by fitting a linear combination of the component SRCs (SRCi) to the SRCmix. The resulting value of each weighting coefficient in the fit provides the relative proportion of the corresponding component in the overall sample.

11 Claims, 9 Drawing Sheets

(52) U.S. Cl.
    CPC ....... *G01N 24/084* (2013.01); *G01R 33/4625* (2013.01); *G01R 33/48* (2013.01)

(58) Field of Classification Search
    USPC .......................................................... 324/307
    See application file for complete search history.

(56) References Cited

U.S. PATENT DOCUMENTS

| | | | |
|---|---|---|---|
| 6,661,226 B1* | 12/2003 | Hou ..................... | G01N 24/081 324/303 |
| 6,794,864 B2 | 9/2004 | Mirotchnik et al. | |
| 6,952,096 B2* | 10/2005 | Freedman ............... | E21B 49/08 324/300 |
| 7,688,069 B2 | 3/2010 | Kraus et al. | |
| 8,773,129 B2 | 7/2014 | Griswold et al. | |
| 2005/0216196 A1* | 9/2005 | Akkurt .................... | E21B 49/08 702/6 |
| 2010/0301858 A1* | 12/2010 | Lowery, Jr. ............ | G01R 33/30 324/309 |
| 2012/0116731 A1 | 5/2012 | Eads | |
| 2013/0057279 A1* | 3/2013 | Yu ......................... | G01R 33/50 324/309 |
| 2014/0049257 A1* | 2/2014 | Rapoport ............. | G01N 24/085 324/306 |
| 2015/0145513 A1* | 5/2015 | Li ........................ | G01N 24/081 324/303 |
| 2017/0307699 A1* | 10/2017 | Rodgers ................. | G01R 33/50 |

OTHER PUBLICATIONS

Santos, P.M., Amais, R.S., Colnago, L.A., Rinnan, Å. and Monteiro, M.R., 2015. Time domain-NMR combined with chemometrics analysis: an alternative tool for monitoring diesel fuel quality. Energy & Fuels, 29(4), pp. 2299-2303. (Year: 2015).*

Besghini, D., Mauri, M. and Simonutti, R., 2019. Time domain NMR in polymer science: from the laboratory to the industry. Applied Sciences, 9(9), p. 1801. (Year: 2019).*

Berman, P., Leshem, A., Etziony, O., Levi, O., Parmet, Y., Saunders, M. and Wiesman, Z., 2013. Novel 1 H low field nuclear magnetic resonance applications for the field of biodiesel. Biotechnology for biofuels, 6(1), p. 55. (Year: 2013).*

Dalitz, F., Kreckel, L., Maiwald, M. and Guthausen, G., 2014. Quantitative medium-resolution NMR spectroscopy under non-equilibrium conditions, studied on the example of an esterification reaction. Applied Magnetic Resonance, 45(5), pp. 411-425. (Year: 2014).*

Barbosa, L.L., Kock, F.V., Silva, R.C., Freitas, J.C., Lacerda Jr, V. and Castro, E.V., 2013. Application of low-field NMR for the determination of physical properties of petroleum fractions. Energy & fuels, 27(2), pp. 673-679. (Year: 2013).*

Zheng, X., Jin, Y., Chi, Y. and Ni, M., 2013. Simultaneous determination of water and oil in oil sludge by low-field 1H NMR relaxometry and chemometrics. Energy & fuels, 27(10), pp. 5787-5792. (Year: 2013).*

Guthausen, G., Räntzsch, V., Biquet, C., Schlabach, S. and Wilhelm, M., 2014. Investigation of Polymer-Filler Interactions in TiO2-Filled Poly (n-alkyl methacrylates) by Low-Field NMR Relaxometry. Macromolecular Chemistry and Physics, 215(9), pp. 851-858. (Year: 2014).*

Stork, H., Gädke, A. and Nestle, N., 2006. Single-sided and semisingle-sided NMR sensors for highly diffusive samples: application to bottled beverages. Journal of agricultural and food chemistry, 54(15), pp. 5247-5252. (Year: 2006).*

Otles, S., 2016. Handbook of food analysis instruments. CRC Press. (Year: 2016).*

Andrade, Leticia, et al., "Doubleslicing: A non-iterative single profile multi-exponential curve resolution procedure Application to time-domain NMR transverse relation data", Journal of Magnetic Resonance 189 (2007), p. 286-292.

Kwamen, R. et al., "Estimation of Self-Diffusion Coefficients of Small Penetrants in Semicrystalline Polymers Using Single-Sided NMR", Macromolecular Rapid Communications (2012), vol. 33, p. 943-947.

Nordon, Alison et al., "Quantitative Analysis of Low-Field NMR Signals in the Time Domain", Analytical Chemistry (Sep. 1, 2001), vol. 73, No. 17, p. 4286.

Pedersen, Henrik Toft et al., "Towards Rapid and Unique Curve Resolution of Low-Field NMR Relaxation Data: Trilinear Slicing versus Two-Dimensional Curve Fitting", Journal of Magnetic Resonance (2002), vol. 157, p. 141-155.

Virtanen, Tommi et al., "Quantitation of a polymorphic mixture of an active pharmaceutical ingredient with solid state C CPMAS NMR spectroscopy", International Journal of Pharmaceutics (2010) vol. 394, p. 18-25.

Kalabin G. et al., "Identification and quantitative determination of active pharmaceutical ingredients in suppositories by a combination of 1H NMR spectroscopy and desorption mass spectrometry", Russian Chemical Bulletin, Springer NY LLC, vol. 63, No. 8 (Apr. 28, 2015).

Todt H. et al., "Quality control with time-domain NMR", European Journal of Lipid Science and Technology, vol. 103 (2001) p. 835-840.

Windig W. et al., "Direct exponential curve resolution algorithm (DECRA): A novel application of the generalized rank annihilation method for a single spectral mixture data set with exponentially decaying contribution profiles", Chemometrics and Intelligent Laboratory Systems, vol. 37 (1997) p. 241-254.

Chamberlain, Joseph, "JPAG: Characterisation of active pharmaceutical ingredients", The Pharmaceutical Journal, (Dec. 14, 2010), p. 1-5.

Vogt, Frederick G., "Evolution of solid-state NMR in pharmaceutical analysis", Future Medical Chemistry, vol. 2, No. 6, Jun. 2010, p. 915-921.

* cited by examiner

RAPID QUANTIFICATION OF COMPONENTS IN SOLID MIXTURES OF CHEMICALS VIA TIME-DOMAIN NMR SPECTROSCOPY

BACKGROUND OF THE INVENTION

1. Field of the Invention

The subject matter disclosed generally relates to nuclear magnetic resonance (NMR) spectroscopy. More specifically, it relates to time-domain NMR spectroscopy.

2. Description of the Related Art

Various spectroscopic technologies are used to determine the composition of materials or mixtures. The choice of a particular spectroscopic technology depends on various factors, such as the nature of the compound, its physical state, the extent to which the identity of the compound is known, etc.

Active pharmaceutical ingredients (APIs) rank among the compounds for which challenges arise during spectroscopic identification and quantification. APIs often exhibit extensive polymorphism and the tendency to form solvates and hydrates. The selection and development of the optimal polymorphic API form are often complicated by the complex phase behavior of the API. In addition, the interaction of the desired API lead form with excipients in formulations during processing or during long-term storage may lead to form change and/or amorphization. In many cases, the physical formulation process itself causes API lead form changes and/or amorphization. Consequently, APIs and formulated materials studied in early drug development often contain complex mixtures composed of the desired API lead form in the presence of other polymorphs, solvates, amorphous material, and excipients. The ability to characterize and quantify relevant API forms in these complex mixtures in the presence of each other and excipients is crucial in the early drug development process because polymorphs often exhibit distinct physical properties that may alter the dissolution and bioperformance, processability and/or chemical stability of formulated drug product. These challenges apply not only to APIs but to fine chemicals in general, that is, high-purity chemicals produced with a specified chemical structure and morphologically defined (i.e., specific crystal form or entirely amorphous), often used as starting materials for specialty chemicals, such as pharmaceuticals, biopharmaceuticals and agrochemicals.

Typical analytical tools to analyze API and formulated pharmaceutical materials include X-ray powder diffraction, optical and vibrational spectroscopy, and thermometric methods like differential scanning calorimetry (DSC) and thermogravimetry (TG). In recent years, high-field and high resolution solid-state NMR (ssNMR) has emerged as a tool for analyzing API and formulated pharmaceutical materials in the solid state. Existing ssNMR methods identify API polymorphs by their individual chemical shifts in the frequency domain spectrum after Fourier transformation of the free induction decay (FID). Working in the frequency domain requires the acquisition of high resolution data.

In addition, in some cases polymorphs can be distinguished by their $T_2$ and $T_1$ spin relaxation times. Multi-nuclei ($^{13}C$, $^1H$, $^{19}F$, $^{35}Cl$, $^{14}N$) 1D and 2D ssNMR correlation experiments have been especially useful in characterizing amorphous solid dispersion formulations. Several ssNMR-based methods to quantify components in mixtures have been proposed. These methodologies include a number of chemometrics approaches, signal deconvolution, corrected signal integration, and relaxation based methods. Among the chemometrics NMR tools, the direct exponential curve resolution algorithm (DECRA) has been applied most frequently on a variety of materials, including pharmaceuticals, polymers, and human brain MRI. However, for all of these known approaches, capital-intensive equipment and highly-trained scientists are typically required and the methods are time-consuming.

SUMMARY OF THE INVENTION

According to an exemplary embodiment of the invention, there is provided a method for determining the relative quantities of the expected components in a multi-component mixture of solids. The proposed quantification method makes use of a time domain nuclear magnetic resonance (TD-NMR) spectrometer and requires that, for each of the expected components in the mixture, a $T_1$ saturation recovery curve (SRC) is obtained for a nucleus such as $^1H$, $^{13}C$, $^{19}F$ or $^{31}P$. The SRC for each component ($SRC_i$) may be acquired utilizing the TD-NMR spectrometer, or may be retrieved from a database from a previous measurement. The saturation recovery curve for the mixture sample ($SRC_{mix}$) is determined from a measurement of the sample with the TD-NMR spectrometer, either the same or a different one from the TD-NMR spectrometer used to acquire the component SRCs.

Once the $SRC_{mix}$ has been obtained, the relative amounts of the expected components present in the mixture sample are determined by fitting a linear combination of the component SRCs ($SRC_i$) to the $SRC_{mix}$. The fitting may comprise identifying the weighting coefficients that minimize a representative value, e.g., a variance, of the difference vector between the $SRC_{mix}$ and the linear combination of the component SRCs. In an exemplary embodiment, the fitting comprises minimization of a representative value of the expression:

$$SRC_{mix} - \left( \sum_{i=1}^{N} c_i^{norm} SRC_i^{norm} + b^{norm} \right),$$

where $SRC_i^{norm}$ is a normalized form of the $i^{th}$ component SRC, $b^{norm}$ is an arbitrary offset value, and $c_i^{norm}$ is the weighting coefficient of the normalized $i^{th}$ component SRC in the fit. The normalization can reflect, for example, operational parameters of the TD-NMR spectrometer and/or parameters such as a molecular weight and a number of protons of each component. When minimized by adjustment of the weighting coefficients $c_i^{norm}$, the resulting value of each weighting coefficient provides the relative proportion of the corresponding component in the overall sample, or is indicative of the relative proportion. Thus, the proportions provided by the weighting coefficients in the fit reflect the relative quantities of the different components in the sample. An offset, $b^{norm}$, can included in the fit in order to account for experimental imperfections.

The invention may be applied in a number of different applications. For example, the component SRCs may be obtained for at least two polymorphs, solvates or hydrates of a compound. According to one particular embodiment of the invention, the component SRCs are obtained for at least one active pharmaceutical ingredient and at least one excipient component of a pharmaceutical formulation.

BRIEF DESCRIPTION OF THE DRAWINGS

Further features and advantages of the present disclosure will become apparent from the following detailed description, taken in combination with the appended drawings, in which.

DETAILED DESCRIPTION

Figure 1:
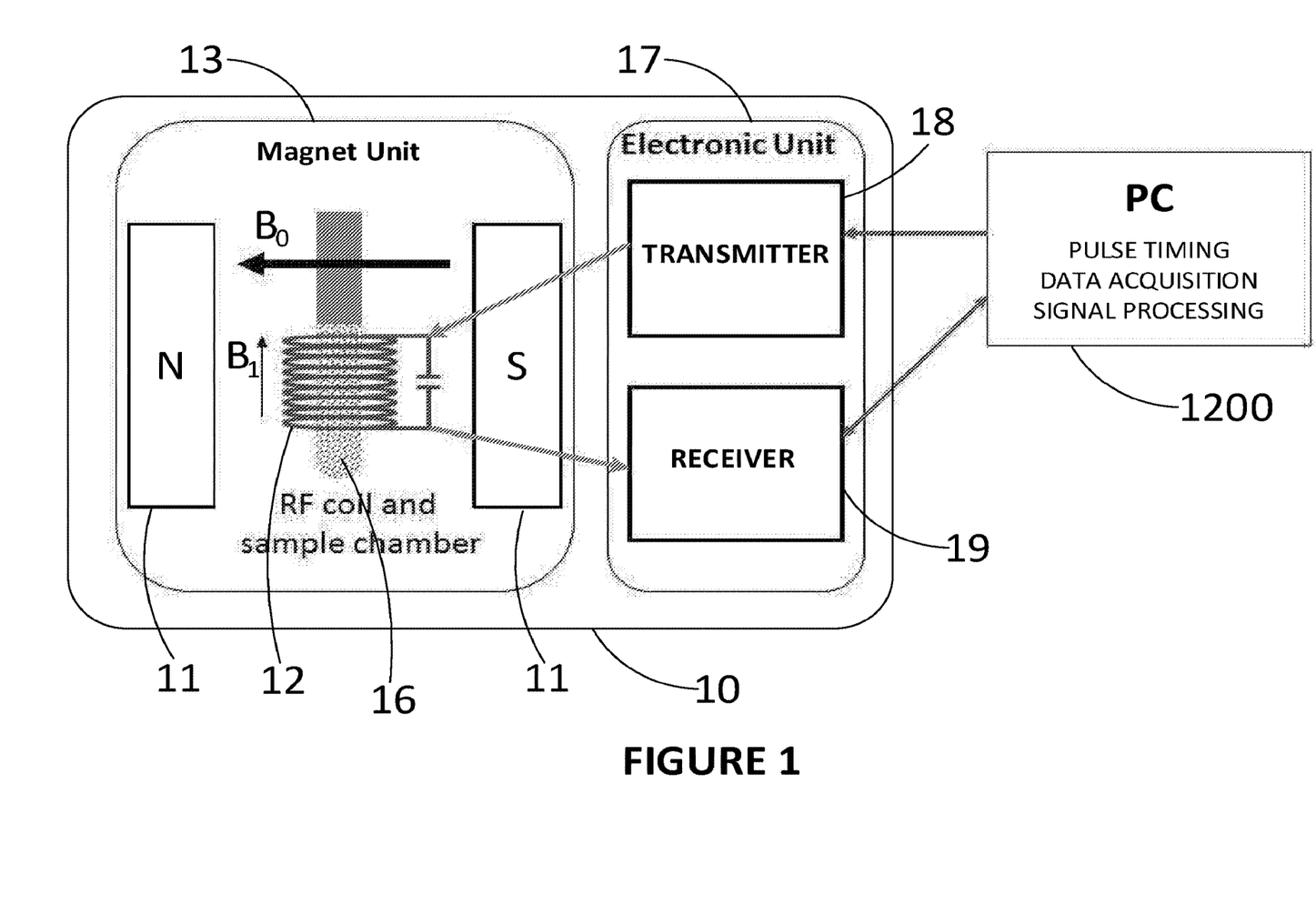
FIG. 1 is a block diagram illustrating the components of a time-domain nuclear magnetic resonance (TD-NMR) spectrometer, according to an exemplary embodiment of the invention.

Shown in FIG. 1 is a time-domain nuclear magnetic resonance (TD-NMR) spectrometer 10 that may be used for the quantification of compounds in solid mixtures in accordance with the present invention. The TD-NMR spectrometer 10 comprises a magnet unit 13 having a permanent magnet system 11 which generates a magnetic field $B_0$ between its magnetic poles. A sample chamber 16, in which the sample is located, lies within the most homogeneous part of the magnetic field. An RF coil 12 surrounds the sample chamber 16 and, when the instrument is operated, transmits RF pulses originating from transmitter 18 that cause excitation of the sample. Following the excitation, the sample induces a material-characteristic free-induction decay response in the RF coil 12 which is detected in conjunction with receiver 19. As shown in FIG. 1, the transmitter 18 and receiver 19 can be provided together as part of an electronic unit 17. A computing device 1200, which may be an external host computer, is connected to the electronic unit 17 and provides control of the transmitter 17 and receiver 19. The computer also operates to provide the necessary pulse timing, as well as performing various data acquisition and signal processing functions.

Time-domain NMR (TD-NMR) can be used to measure bulk relaxation in solid materials, and omits Fourier transformation of the acquired free induction decay (FID) to the frequency domain. For the method described herein, high spectral resolution in the frequency domain is not needed, so the result may be obtained without sophisticated and expensive technology, such as ultra-homogeneous, high-field magnets (e.g., ≥9.4 T with better than parts-per-million (ppm) homogeneity over sample volumes on the milliliter scale).

Advantageously, TD-NMR spectroscopic instruments can be provided as tabletop instruments. As such, they occupy less space and are less costly to purchase and operate as compared to their high-resolution ssNMR counterparts. This is why TD-NMR spectroscopic instruments are popular in industrial settings, for example in quality control processes. Moreover, in the TD-NMR approach, only the first few points (e.g., about 6-8) of the FID are acquired and averaged, resulting in a considerably reduced amount of time required to conduct the relaxation measurement.

Another significant benefit of using a TD-NMR instrument is the capability of analyzing very heterogeneous samples, e.g., pharmaceutical formulations in tablet, capsule, gel, or paste form, as well as rubbers, polymers, and soils. By contrast with conventional high-resolution ssNMR analysis, there is no requirement on sample texture or homogeneity, and "magic-angle" spinning is not necessary. A large variety of solids can be introduced into the sample chamber 16.

In the present invention, FID intensities are used to construct the corresponding saturation recovery curves (SRCs) from which quantification can be performed. Notably, the SRC of a given sample embodies a composite of the different SRCs of its components. Such a curve would typically display multi-exponential behavior due to the variety of $T_1$ relaxation times of its components. However, even pure materials can exhibit multiple relaxation rates and give rise to SRCs with multi-exponential behavior. The multi-exponential behavior of the SRC of pure materials complicates their identification and quantification in the time-domain.

There have been attempts to use the Inverse Laplace Transform (ILT) to decompose bulk relaxation curves measured by TD-NMR into their individual contributions. Indeed, the ILT can be used to extract exponential components from a multi-exponential graph such as the $T_1$ or $T_2$ relaxation curve of a mixture. Moreover, from the resulting relaxation time distribution plot the components may be quantified relative to each other using ILT. For a full determination of the relaxation time profile from a saturation recovery experiment for a mixture of N components, each component i containing some number $M_i$ of distinctly relaxing spins, would be fit to $$I(t) = I_0 \sum_{i=1}^{N} p_i (\sum_{j=1}^{M_i} f_{ij}(1-\exp[-t/(T_1)_{ij}])), \qquad (a)$$

where t is time, $I_0$ is the overall intensity, $p_i$ is a weighting factor specifying the relative signal contribution of the $i^{th}$ component, and $(T_1)_{ij}$ represents the time constants characteristic of each subpopulation of distinctly relaxing spins in that component. The $f_{ij}$ are fixed, compound-specific properties reflecting the fractional contributions of its subpopulations to the signal. Thus, fitting the profile observed from a multi-component mixture to equation (a) entails searching for the optimum values of $M_{total}$ time constants $(T_{1,ij})$ (where $(M_{total}=\Sigma_{i=1}^{N}M_j)\geq N)$, of N weighting factors $(p_i)$, and of one overall intensity $(I_0)$.

However, the ILT methodology described above often results in misleading and inaccurate fits when a variety of solutions (i.e., optimum or near-optimum parameter sets) may yield a similar quality of fit. For example, even in fitting to the profile of a pure compound as a single polymorph (N=1), it can be difficult to determine multi-exponential behavior (M>1) for similarly relaxing subcomponents. Therefore, ILT fails to quantify components in an unambiguous and reliable way. However, clear and consistent quantification methods for TD-NMR instruments are needed in order to take advantage of the many benefits these instruments offer.

Unlike prior approaches, the present invention uses $^1$H and $^{19}$F $T_1$ saturation recovery curves (SRCs) obtained using a TD-NMR instrument, such as a Bruker Minispec mq20 benchtop instrument, not by extracting relaxation parameters, but rather as a fingerprint in which specific details of the recovery, such as time constants and/or possible multi-exponentiality, remain unknown and unquantified. For the analysis of a given mixture, the SRCs for the relevant pure components, as well as for the mixture itself are measured. The relative amounts of the mixture components are obtained from a fit of the mixture SRC with a linear combination of normalized and weighted SRCs of the pure components. The method that uses SRCs to quantify mixture components will occasionally be called QSRC hereinafter.

The QSRC method circumvents the problems associated with quantifying components in mixtures using full relaxation profiles by replacing the complexity of an individual-component relaxation with a measured SRC as a "fingerprint", $I_i(t)$, for each substance present in a mixture. In this case, equation (a) simplifies to:

$$I(t)=I_0\Sigma_{i=1}^{n}p_iI_i(t) \qquad (b)$$

Thus, no time constant needs to be retrieved from the data, even though the time profile observed from a sample reflects a composite of several relaxation times, including even multi-exponential sets for individual components. Here, unlike in prior approaches in which the $T_{1,ij}$ values needed to be characterized, only critical $p_i$ values are explicit in the equation and thus need to be obtained. In the method described herein, the $T_{1,ij}$ values remain uncharacterized, but are implicitly represented by premeasured SRCs of the expected components.

Figure 2:
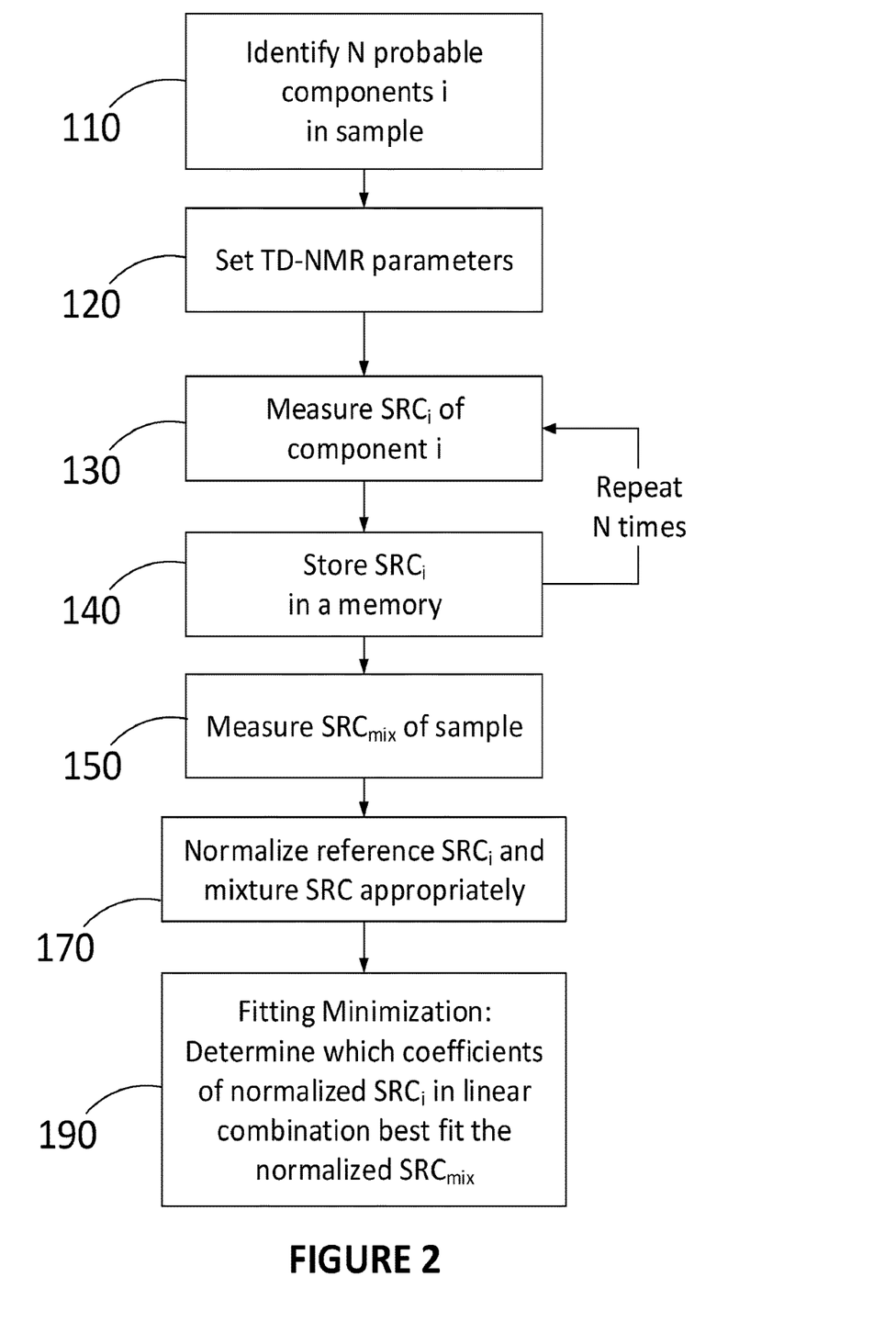
FIG. 2 is a flowchart illustrating a method for quantifying compounds in a mixture using TD-NMR spectroscopy, according to an exemplary embodiment of the invention.

The QSRC method described herein is depicted in the flowchart of FIG. 2. The compounds in the mixture are first identified (step 110) prior to data collection. Usually, compounds found in a pharmaceutical formulation are known and therefore expected to be in the solid mixture; the QSRC method is directed to determining the respective proportions of these expected compounds in the mixture (typically as a relative mass percentage of all components). Failure to identify the existence of an NMR-reactive compound in the solid mixture may result in an incorrect quantification (i.e., the linear combination of component SRCs will not fit well the experimental mixture $SRC_{mix}$).

Following identification of the probable sample components, the operational parameters of the instrument (number of scans per recovery increment, number of points on the SRCs, time profile of points, etc.) are set (step 120). Once the TD-NMR instrument is ready, each one of the pure compounds from the list identified in step 110 is individually measured using the TD-NMR instrument (step 130) and the corresponding reference SRC is stored, such as in the memory of a host computer of the TD-NMR instrument. Steps 130 and 140 are then repeated for each of the probable sample components so as to construct a set of reference SRCs. The set of reference SRCs may also be constructed in advance and stored in a database, to be accessed later during the sample analysis procedure.

In step 150, the mixture known to comprise the components in unknown concentrations is then measured using the TD-NMR instrument. The SRCs of each of the components and the mixture are then normalized (step 170). In an exemplary embodiment, normalization includes various scaling factors applied to the SRCs based on the parameters of data acquisition by the instrument and component chemical properties, notably the molecular weight and number of protons of the mixture components. Once all SRCs are scaled appropriately, a fitting process is used to find the coefficients of normalized reference SRCs that provide the best fit to the mixture SRC (step 190). The fitting parameters c represent the concentrations of the components identified in step 110.

The accuracy of the QSRC method of the present invention is demonstrated below in the $^1$H and $^{19}$F SRC data measured on several model systems. Since the method is based on differences in SRCs, $^1$H and $^{19}$F model systems containing components with different $T_1$ ratios are investigated. $^1$H SRC data on numerous physical binary blends of ibuprofen and indomethacin, and of ibuprofen and itraconazole, illustrate how well the method based on $^1$H SRC data reproduces the prepared blend compositions. To establish how well the QSRC method works for observing $^{19}$F, $^{19}$F SRCs of several binary physical blends of 2-trifluoromethyl cinnamic acid and 6-trifluoromethyl uracil and of 2-trifluoromethyl cinnamic acid and fluoxetine HCl were analyzed.

EXPERIMENTAL DETAILS

Figure 3:
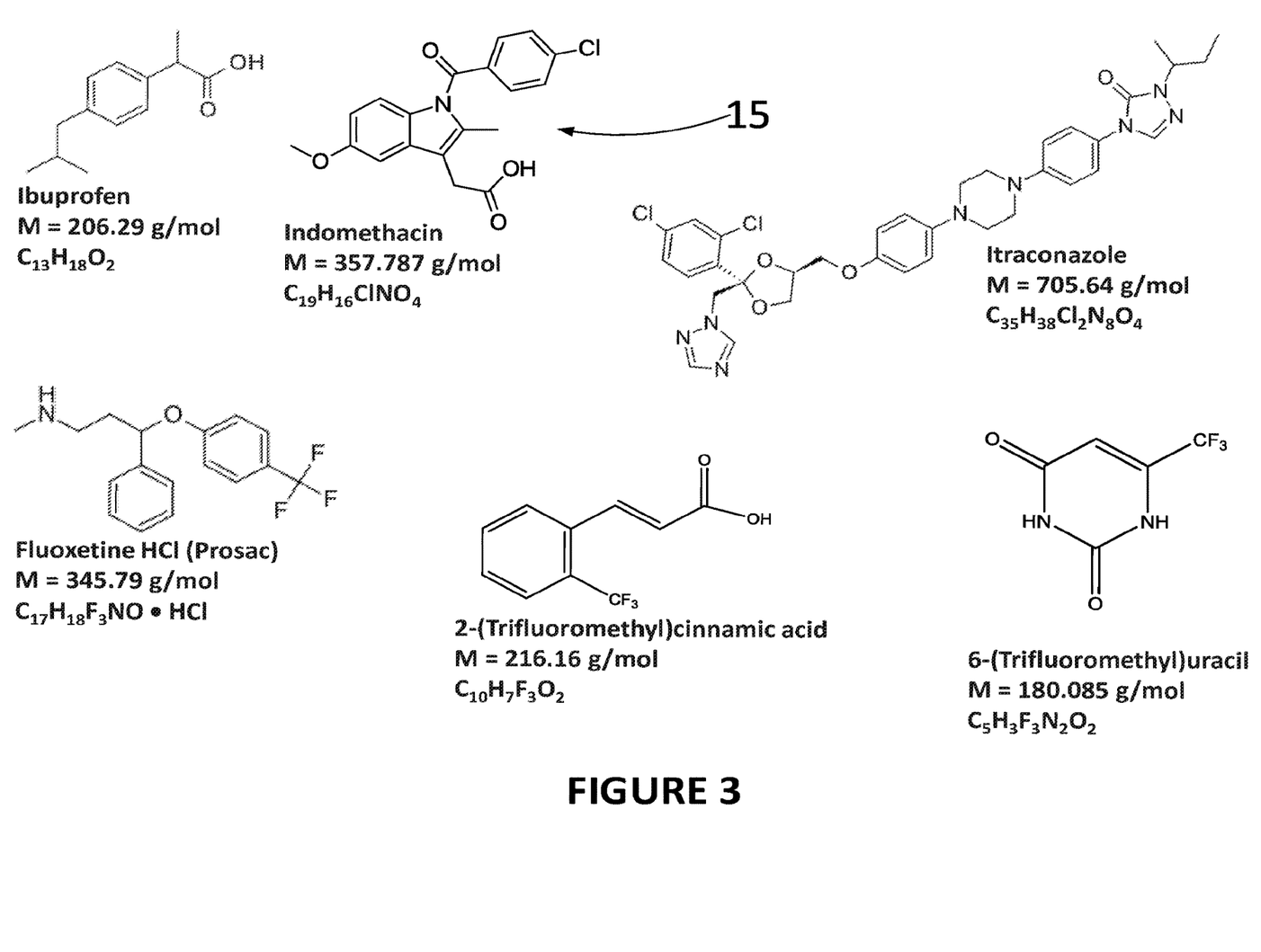
FIG. 3 shows the chemical structures of model compounds utilized in the proof of concept of the present invention.

Experiments were performed on different mixtures of model compounds 15 shown in FIG. 3 to demonstrate the feasibility and reliability of component quantification of solid mixtures according to the present invention.

Samples

As shown in FIG. 3, the model compounds 15 discussed herein comprise ibuprofen, indomethacin, itraconazole, 2-trifluoromethyl cinnamic acid, 6-trifluoromethyl uracil, and fluoxetine HCl. Fluoxetine HCl was recrystallized from water before use; all other model compounds were utilized as obtained from the vendor. FIG. 3 shows the structures, molecular weights, and formulas of the model compounds. Several binary blends of the model compounds 15 with various compositions were prepared. Tables 1 through 4 show the corresponding compositions.

TABLE 1

Compositions of the binary blends of ibuprofen and indomethacin.

| Blend Name | Bl-1 | Bl-2 | Bl-3 | Bl-4 | Bl-5 | Bl-6 | Bl-7 |
|---|---|---|---|---|---|---|---|
| m (Ibu) [mg] | 205.456 | 126.202 | 120.092 | 90.466 | 60.506 | 29.64 | 15.086 |
| m (Indo) [mg] | 203.712 | 124.196 | 180.674 | 210.024 | 240.898 | 270.514 | 285.38 |
| m % Ibu | 50.2 | 50.4 | 39.9 | 30.1 | 20.1 | 9.9 | 5.0 |

TABLE 2

Compositions of the binary blends of ibuprofen and itraconazole.

| | Bl-1 | Bl-2 | Bl-3 | Bl-4 | Bl-5 | Bl-6 | Bl-7 |
|---|---|---|---|---|---|---|---|
| m (Ibu) [mg] | 163.080 | 151.184 | 116.426 | 85.502 | 55.968 | 32.982 | 16.084 |
| m (Itra) [mg] | 140.432 | 151.318 | 184.652 | 215.060 | 244.778 | 268.402 | 285.846 |
| m % Ibu | 53.7 | 50.0 | 41.4 | 30.0 | 20.1 | 10.1 | 5.3 |

TABLE 3

Compositions of the binary blends of 2-trifluoromethyl cinnamic acid and 6-trifluoromethyl uracil.

| | Blend Name | | | | |
|---|---|---|---|---|---|
| | Bl-1 | Bl-2 | Bl-3 | Bl-4 | Bl-5 |
| m (6TFMU) [mg] | 2621.571 | 1496.472 | 495.511 | 301.410 | 153.316 |
| m (2TFMCA) [mg] | 405.647 | 1413.120 | 2525.890 | 2673.836 | 2885.314 |
| m % 6TFMU | 86.6 | 51.4 | 16.1 | 10.1 | 5.5 |

TABLE 4

Compositions of the binary blends of 2-trifluoromethyl cinnamic acid and fluoxetine HCl.

| | Blend Name | | |
|---|---|---|---|
| | Bl-1 | Bl-2 | Bl-3 |
| m (FXT HCl) [mg] | 967.262 | 631.693 | 115.667 |
| m (2TFMCA) [mg] | 502.741 | 2390.760 | 945.501 |
| m % FXT HCl | 65.8 | 20.9 | 10.9 |

Time-Domain NMR

All experiments were conducted on a commercial Mq20 bench-top TD-NMR spectrometer from BRUKER BioSpin Corp., Billerica, Mass., at a magnetic field of 0.47 Tesla (19.95 MHz $^1$H Larmor frequency) generated by a permanent magnet with 25 mm gap size. The magnetic field of the permanent magnet was kept constant by controlling the magnet temperature at 40±0.001° C. The instrument was equipped with a $^1$H probe exhibiting a 6.7 μs receiver dead-time, accommodating 10 mm glass tubes as sample holders, and a $^{19}$F probe possessing a 21.1 μs receiver dead-time accommodating 18 mm glass tubes as sample holders. The probe for $^1$H measurements is a variable temperature probe and all $^1$H detected experiments were performed at 20° C., temperature-controlled with a Julabo chiller unit. The probe for $^{19}$F measurements does not allow for temperature control and all $^{19}$F observed experiments were performed at the temperature of the sample orifice which is approximately 40° C., close to the magnet temperature. $T_1$ saturation recovery curves were measured by using a standard pulse program with a 50 ms saturation pulse train, followed by an exponentially incremented recovery delay, and a 90° read out pulse. The recycle delay was 0.1 s for all experiments. Typical 90° pulse lengths were about 2.8 μs for $^1$H and 4.5 for $^{19}$F. The number of recovery delay increments was varied in order to study respective effects on the analysis. The longest recovery delay used in the experiments was adjusted for each experiment to allow the relevant model compounds to reach full recovery.

Values of all parameters listed above are those that were used during the experiments. The method described herein can be performed without being limited to these values; other parameters with which TD-NMR instruments are known to be operable may also be used.

QSRC Method

The QSRC method is based on the expression of a given SRC collected for a physical mixture of solids, $SRC_{mix}$, as a linear combination (i.e., weighted average) of the SRCs of the individual components, $SRC_i$. With the right coefficients (i.e., proportions) that need to be determined, the SRCs of the individual components can be summed up to the $SRC_{mix}$ with a minimum error.

$$SRC_{mix} = \sum_{i=1}^{N} c_i SRC_i + b \quad (1)$$

In equation (1), each of the SRCs is a vector having points consisting of the respective signal intensities, I, at the n recovery times:

$$SRC = \{I_1, I_2, I_3, \ldots, I_n\} \quad (2)$$

Figure 4:
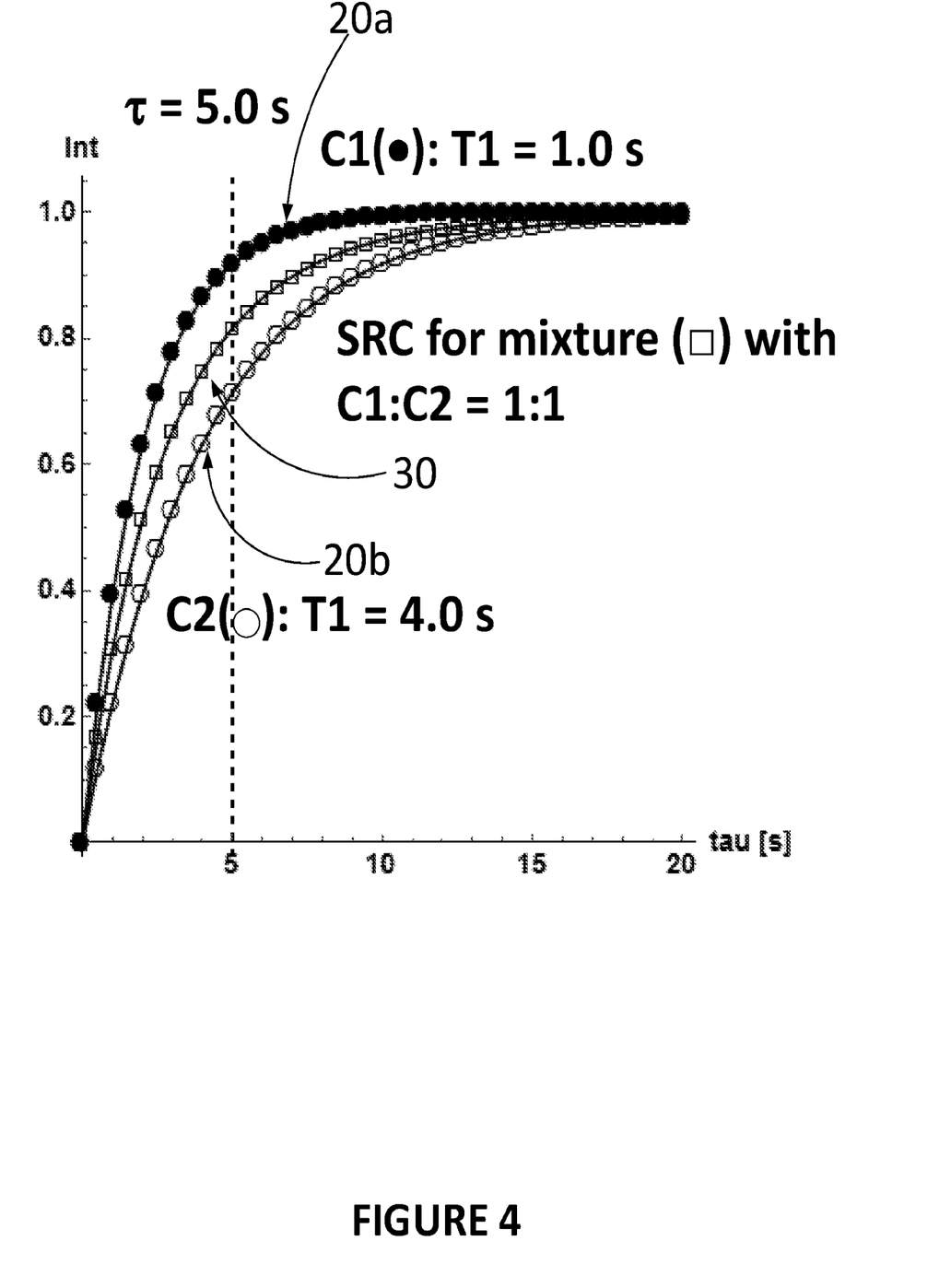
FIG. 4 is a graph depicting computer simulated $T_1$ saturation recovery curves of a hypothetical two-component system. Shown are the SRCs for the two components and for a mixture thereof, demonstrating the principle of the invention.

As such, the summing of SRCs (e.g., the linear combination shown in equation (1)) may be performed on a point-by-point basis. Furthermore, $c_i$, N, and b are, respectively, the fraction of component i in the mixture, the number of components in the mixture, and an arbitrary offset. The arbitrary offset b is usually small and results from experimental imperfections. FIG. 4 shows the linear combination of SRCs for a hypothetical two-component system. In the figure, there is represented the $SRC_{mix}$ (square points, 30) of a 1:1 mixture of a first component (filled round points, 20a) with $T_1$=1.0 s, and a second component (unfilled round points, 20b) with $T_1$=4.0 s. It is visually apparent that the $SRC_{mix}$ 30 is a weighted average of the individual compounds SRCs (20a, 20b). Accordingly, at the recovery time data point τ=5.0 s, the intensity of the mixture SRC is given by:

$$I_{mix,\tau=5.0\ s} = 0.5 I_{1,\tau=5.0\ s} + 0.5 I_{2,\tau=5.0\ s} \tag{3}$$

For illustration purposes, the recovery points in FIG. 4 are distributed equally in time. However, in practice, SRC time points are usually collected non-uniformly in time, e.g., logarithmically. Also, the offset b is omitted in FIG. 4 for simplicity.

According to an exemplary embodiment of the invention, the reference SRCs are appropriately scaled and normalized. This is done in order for the approach of using a linear combination of SRCs to be generally applicable to quantifying the components in a mixture.

Generally, the intensity of a signal measured by an NMR instrument is dependent upon three key parameters: the number of scans acquired, the sample mass (equivalent to the number of moles of the observed nucleus), and the characteristic electronic properties and receiver gain settings of the instrument. In the proposed quantification method, the reference SRCs (20a, 20b) are rendered independent of the sample masses, number of scans, and instrument characteristics and receiver gain settings. This normalization has clear advantages and is discussed below. This normalization is performed by dividing a given reference SRC (20a, 20b) by the product of the mass ($m_{molecule}$) of the corresponding reference molecule, the number of scans (ns) acquired per recovery increment, and the signal intensity ($S_0$) observed for a given receiver gain setting per scan and per mole of the observed nuclei, as shown in equation (4):

$$SRC_i^{norm} = \frac{SRC_i}{m_{molecule} n s S_0} \tag{4}$$

Equation (4) can be simplified and its utility significantly enhanced when combined with two other expressions. First, the intensities of SRC data points for τ>5 $T_1$ is given by:

$$I_{\tau \geq 5T1} = nN n s S_0 \tag{5}$$

where nN is the number of moles of the observed nuclei. Second, the mass of a given reference molecule can be expressed as a function of the number of moles of the observed nuclei per moles of reference molecule, NN (e.g., NN=18 for a $^1$H SRC of ibuprofen):

$$m_{molecule} = n_{molecule} M = \frac{nM}{NN} M \tag{6}$$

Here, $n_{molecule}$ and M are the number of moles of reference molecules and the molecular mass of the reference molecule, respectively. Combining equations (4)-(6) yields the normalized reference SRC as:

$$SRC_i^{norm} = \frac{SRC_i NN}{I_{i,\tau > 5T1} M} \tag{7}$$

In effect, every intensity along a given reference SRC is divided by the product of the intensity of the same SRC at τ>5$T_1$ (last recovery point collected, also the maximum value of the SRC) and the molecular mass of the respective reference molecule, and multiplied by the number of moles of observed nuclei per moles of reference molecules.

After normalization, the normalized reference SRCs can be utilized in the linear combination of reference SRCs with the weighting coefficients, $c_i^{norm}$, and the arbitrary offset, $b^{norm}$ as fitting parameters. The parameters of the linear combination which minimize the difference between the linear combination and the mixture SRC should be found, as formalized in equation (8).

$$\text{Minimize}\left[ SRC_{mix} - \left( \sum_{i=1}^{N} c_i^{norm} SRC_i^{norm} + b^{norm} \right) \right] \tag{8}$$

Since the bracketed expression in equation (8) represents a vector, a scalar value of this vector is minimized, as explained further below in conjunction with FIG. 7. If the reference SRCs are normalized in accordance with equation (4) (or, equivalently, equation (7)), the weighting coefficients, $c_i^{norm}$, reflect the composition of the analyzed mixture by mass. Therefore, the mass composition of the mixture can be determined by normalizing SRCs and by resolving equation (8) for all values of $c_i^{norm}$.

The normalization as described in equation (7) has noteworthy advantages. It makes it entirely unnecessary to determine any sample masses, and uncertainties about the size and position of the active space in the sample tubes are completely circumvented. Moreover, the normalization allows for the use of SRCs acquired with different numbers of scans and receiver gain settings in the same analysis.

Results

QSRC Method—Proof Of Concept on $^1$H SRC Data

Figure 5:
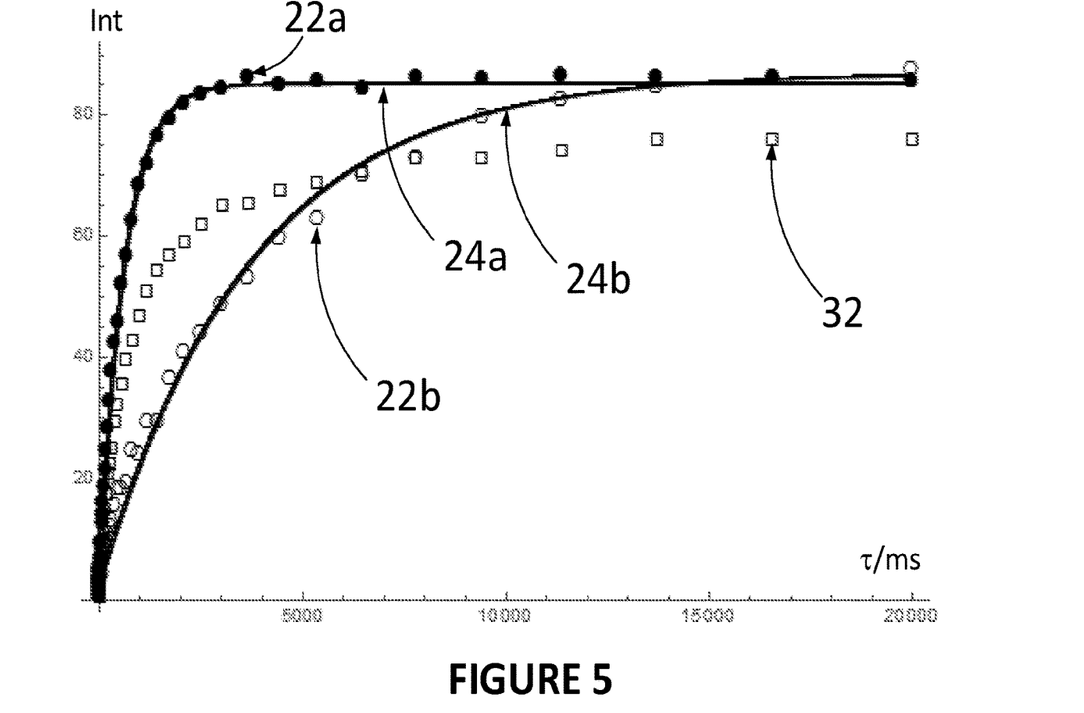
FIG. 5 is a graph illustrating saturation recovery curves of two model compounds measured from TD-NMR spectroscopy and a mixture thereof, according to an exemplary embodiment of the invention.

FIG. 5 shows the raw $^1$H reference SRC data for ibuprofen (filled round points, 22a) and indomethacin (unfilled round points, 22b), as well as the raw $^1$H SRC for the ibuprofen/indomethacin blend containing 50.2% ibuprofen (blend Bl-1 from Table 1) (square points, 32). The SRCs for the two references and the blend were collected with four scans per recovery increment, and fifty logarithmically distributed recovery time points, covering a total delay range from 2-20,000 ms. With these parameters, the total experiment time for collecting one SRC is approximately 8 min. The distinctly different $^1$H $T_1$ relaxation times for the two reference compounds and the somewhat intermediate behavior of the blend are apparent. The raw SRCs for the two references and the blend plateau at different arbitrary intensity levels due to different sample masses and number of protons in the molecules.

FIG. 5 further illustrates the best fits of the reference SRCs (20a, 20b) to a mono-exponential recovery behavior (black solid lines, 24a and 24b, respectively). It is apparent from the figure that the SRCs of both model compounds cannot be represented accurately by a mono-exponential recovery, since experimental recovery points differ from the mono-exponential recovery behavior at various locations in both graphs. In particular, the SRC for indomethacin exhibits notable deviation from mono-exponential behavior. This deviation from mono-exponential recovery is due to non-uniform $^1$H $T_1$s for the reference compounds and illustrates the inherent complexity in the NMR relaxation behavior of fine chemicals and the difficulties for a corresponding analysis based on relaxation times. The complications arising from non-mono-exponential behavior are entirely circumvented in the QSRC method, since the SRCs of the model compounds are used as fingerprints for the model compounds, but their individual complicated relaxation behavior is irrelevant for the analysis, i.e., it is already accounted for in the fingerprints. The fits of the reference SRCs to mono-exponential recovery curves (24a, 24b) in FIG. 5 were only used to choose the longest recovery delay time of all components (20,000 ms in FIG. 5) for collecting the SRCs for the QSRC analysis to ensure full recovery is reached, but are immaterial for the QSRC analysis.

Figure 6:
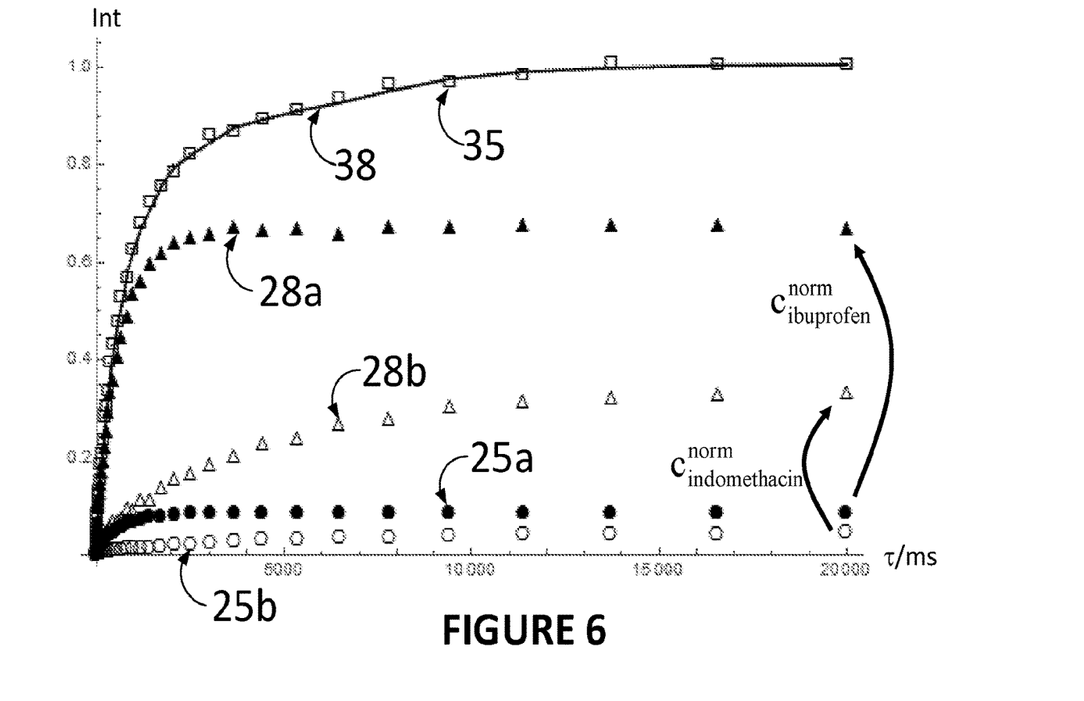
FIG. 6 is a graphical illustration of the fitting of the component SRCs of FIG. 5 to the SRC of the sample mixture.

FIG. 6 displays the SRCs from FIG. 5 after normalization. The two normalized reference SRCs for ibuprofen (filled round points, 25a) and indomethacin (unfilled round points, 25b) were normalized from SRCs (22a, 22b) according to equation (7). The normalization factors for each recovery point n, $$\frac{NN}{MI_n},$$

for ibuprofen and indomethacin are:

$$\frac{18(\text{moles of } observed nuclei/1 \text{ mol of molecule})}{206.29(g/1 \text{ mol of molecule})I_n} \text{ and}$$

$$\frac{16(\text{moles of observed nuclei}/1 \text{ mol of molecule})}{357.787(g/1 \text{ mol of molecule})I_n},$$

respectively. The normalization reduces the arbitrary intensities of the reference SRCs significantly, resulting in plateaus below 0.1, more specifically plateaus of 0.08725 and 0.044719, for ibuprofen and indomethacin respectively (25a, 25b). Accordingly, in order to facilitate an easier and faster minimization procedure, the intensity of the raw blend Bl-1 SRC was scaled to a similar plateau level (e.g., 1.0). All intensities of that blend $SRC_{mix}$ 32 were divided by the intensity of its last point, resulting in the normalized blend SRC 35 (square points) reaching a plateau at 1.0. The normalized SRCs 25a, 25b from FIG. 6 represent the input data for the QSRC analysis of blend Bl-1. Accordingly, the superposition of the normalized SRCs (25a, 25b) was subjected to the minimization fitting procedure introduced in equation (8) with the weighting coefficients $c_{ibuprofen}^{norm}$ and $c_{indomethacin}^{norm}$, and the offset, $b^{norm}$, as fitting parameters.

The actual values obtained for the fitting parameters, $c_{ibuprofen}^{norm}$, $c_{indomethacin}^{norm}$, and $b^{norm}$ are 7.69, 7.49, and −0.0036, respectively. The results of the QSRC analysis for blend Bl-1 are also displayed in FIG. 6. The filled and unfilled triangles represent, respectively, the two normalized reference SRCs (28a, 28b) multiplied (as indicated by arrows) by the weighting coefficients obtained from the fit, and the solid line 38 denotes the blend SRC predicted by the fit, i.e., the linear combination (solid line 38) of normalized SRCs 25a, 25b using the fitting parameters, which is equivalent to the sum of coefficient-weighted normalized reference SRCs (28a, 28b). The coefficients obtained from the fitting procedure directly translate to the relative mass percentages of ibuprofen and indomethacin in the blend Bl-1 as $$100\% \times \frac{7.69}{(7.69 + 7.49)} = 50.6\% \text{ and}$$

$$100\% \times \frac{7.49}{(7.69 + 7.49)} = 49.4\%,$$

respectively.

Figure 7:
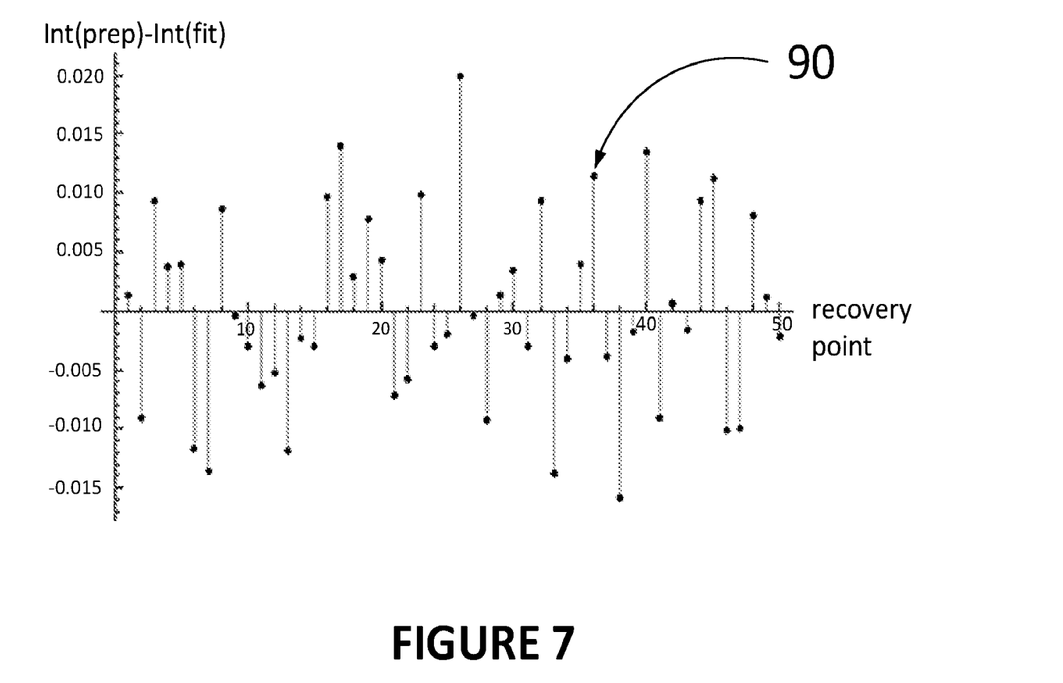
FIG. 7 is a graph illustrating a vector of differences between the actual SRC of a mixture of model compounds and the corresponding mixture SRC determined utilizing the present invention.

FIG. 7 shows the point-by-point differences between the experimental and predicted blend Bl-1 SRCs. The series of values illustrated in FIG. 7 is shown as a difference vector 90, defined as the difference between the normalized $SRC_{mix}$ 35 and the linear combination 38 of normalized SRCs (25a, 25b). Equation (8) should be applied to minimize some representative value of the difference vector 90. The set of fitting parameters that minimizes this representative value is the result of the QSRC analysis. According to an exemplary embodiment, the representative value of the difference vector 90 is the sum of squares of its values, which means that the variance between the normalized $SRC_{mix}$ 35 and the linear combination 38 of normalized SRCs (25a, 25b) is minimized.

From the data in FIGS. 6 and 7, it is evident that the overall agreement between the experimental blend SRC 35 and the predicted blend SRC 38 is excellent. The ratio of the coefficients from the fit directly yields the mass percentages of ibuprofen and indomethacin in blend Bl-1, 50.6% and 49.4%, respectively, as described above. Consequently, the actually prepared composition of blend Bl-1 of 50.2% ibuprofen and 49.8% indomethacin is reproduced within less than half a percent by the QSRC analysis.

Figure 8A:
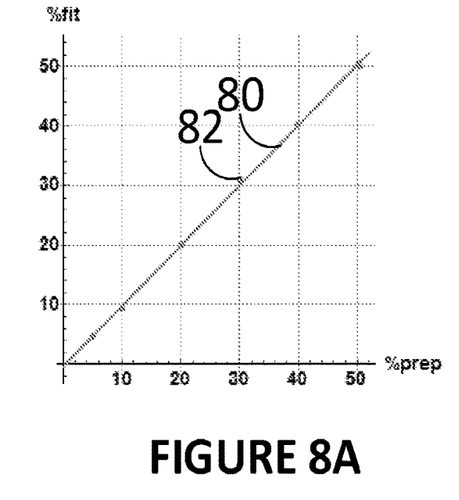
FIGS. 8A-8F are graphs illustrating the concentration of ibuprofen in ibuprofen-containing mixtures as obtained using the method of the invention versus the actual concentration thereof in the mixture, according to various exemplary embodiments of the invention that differ in the number of scans and number of points acquired.
Figure 8B:
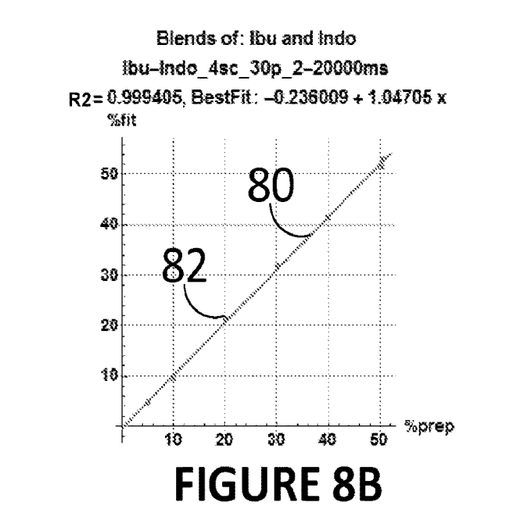
Figure 8C:
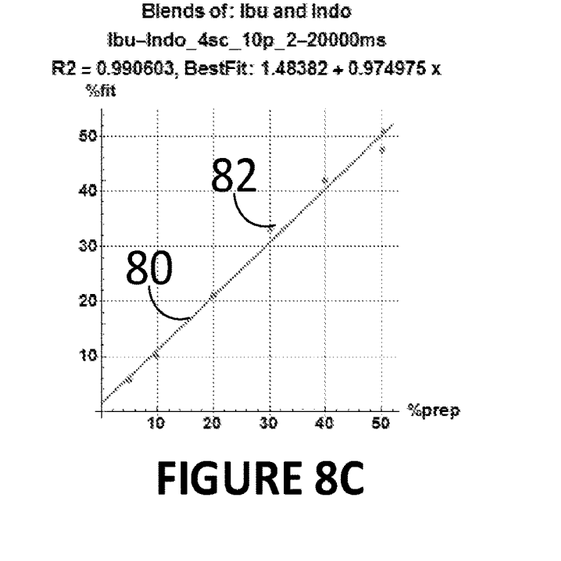
Figure 8D:
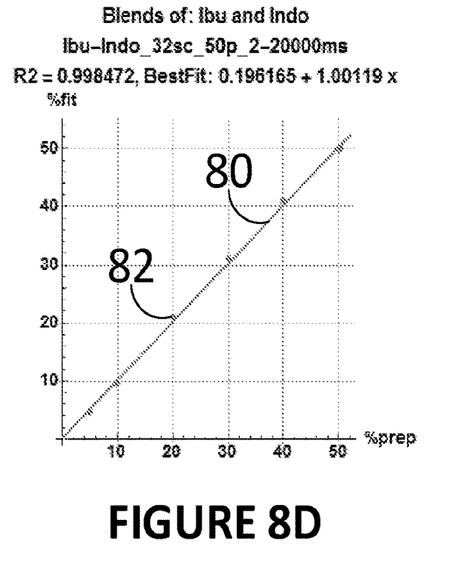
Figure 8E:
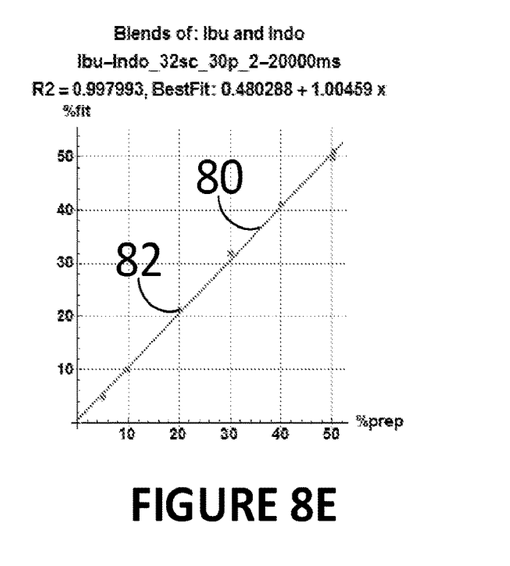
Figure 8F:
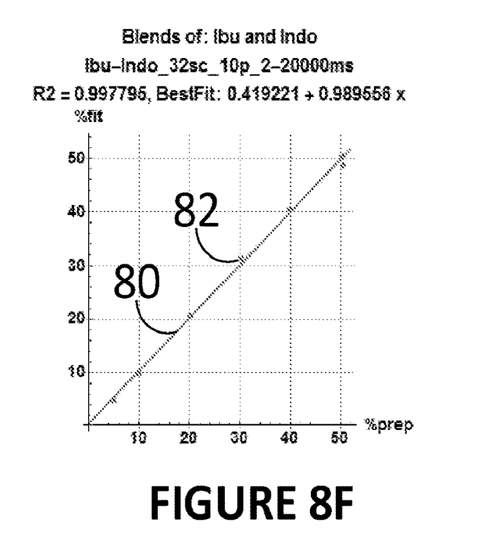

The QSRC analysis is predictive, as evidenced in FIGS. 8A-8F, where the percentage of components in the mixture as prepared and as determined from the QSRC analysis are shown to be highly correlated. The analysis described above was performed on all blends from Table 1 (Bl-1-Bl-7), with known compositions. For example, FIG. 8A shows a plot 82 of the mass percentages for ibuprofen obtained from the QSRC method (y-axis in FIG. 8A) versus the corresponding prepared (i.e., known) mass percentages (x-axis in FIG. 8A) for all seven ibuprofen/indomethacin blend concentrations in Table 5. The plot 82 comprises these seven points in the graph. The data in Table 5 and FIG. 8A demonstrate excellent agreement between the prepared and QSRC-predicted ibuprofen mass percentages over the entire concentration range. Indeed, the regression line 80 (i.e., the first-degree curve fitted to the plot 82) fits the experimental plot 82, which demonstrates the correlation. In particular, the largest observed discrepancy is 0.7%. The data in FIG. 8A exhibit a high correlation coefficient of $R^2=0.9995$, and a substantially perfect slope and intercept of 1.012 and −0.304, respectively. There is therefore a high correlation between the actual values of concentrations in the mixture and the value resulting from the QSRC method.

TABLE 5

$^1$H QSRC results for the ibuprofen/indomethacin binary blends.

| Blend Name | Bl-1 | Bl-2 | Bl-3 | Bl-4 | Bl-5 | Bl-6 | Bl-7 |
|---|---|---|---|---|---|---|---|
| m % Ibu (prep) | 50.2 | 50.4 | 39.9 | 30.1 | 20.1 | 9.9 | 5.0 |
| m % Ibu (fit) | 50.6 | 50.1 | 40.3 | 30.8 | 20.2 | 9.3 | 4.6 |
| rms | 0.0082 | 0.01 | 0.0081 | 0.0097 | 0.0116 | 0.0135 | 0.0120 |

QSRC Method—Effect of Signal-To-Noise and Number of Recovery Points

The number of delay points collected along the SRCs and the signal to noise ratio (SNR) of the SRCs play an important role in the accuracy of the QSRC analysis. The effects of both parameters were explored utilizing the ibuprofen/indomethacin blends 1-7 from Table 1. SRCs of ibuprofen, indomethacin, and all 7 blends were collected with varying number of scans per recovery increment and number of recovery points, and the data analyzed with the QSRC method. Table 6 summarizes the various experimental conditions used. The results of the analyses are displayed in FIGS. 8A-8F as mass percentage correlation plots. Table 6 lists the actual correlation parameters from FIGS. 8A-8F, where discrepancies between the experimental plot 82 and the regression line 80 are shown to be smaller for greater number of scans per recovery point.

TABLE 6

$^1$H QSRC results for the ibuprofen/indomethacin blends utilizing SRCs collected with different experimental conditions.

| Condition Name | Number of scans | Number of points | Exp time | $R^2$ | slope | intercept |
|---|---|---|---|---|---|---|
| 4sc_50p | 4 | 50 | 8 | 0.9995 | 1.012 | −0.304 |
| 32sc_50p | 32 | 50 | | 0.9984 | 1.001 | 0.196 |
| 4sc_30p | 4 | 30 | | 0.9994 | 1.047 | −0.236 |
| 32sc_30p | 32 | 30 | | 0.9980 | 1.005 | 0.480 |
| 4sc_10p | 4 | 10 | | 0.9906 | 0.975 | 1.484 |
| 32sc_10p | 32 | 10 | | 0.9978 | 0.990 | 0.419 |

The data in Table 6 and FIGS. 8A-8F, where the calculated correlation varies according to the number of scans and number of points, suggest that reducing the number of recovery points will eventually lower the accuracy of the method (i.e., worsen the correlation) for low-SNR data. Each row in Table 6 can be associated to one of FIGS. 8A-8F by their condition name, which reflects the number of scans and number of points. The correlation plot for the 4sc_10p data exhibits a detectably lower $R^2$ value and a slope and intercept that deviate more from the theoretical numbers, as compared to the 4sc_50p and 4sc_30p data. On the other hand, if the SNR of the SRC data is improved by collecting 32 scans per increment, nearly perfect correlations are obtained for the 32sc_50p, 32sc_30p, and 32sc_10p conditions. The accuracy-lowering effect of reducing the number of points is not detectable at this high-SNR condition. Overall, the data clearly indicate that the mass percentages of ibuprofen in the binary blends with indomethacin can be determined to high accuracy while spending minimal experimental time. This can be attributed to the significant difference in the $T_1$ relaxation times of the relevant reference compounds ibuprofen and indomethacin. More generally however, increasing the number of scans per recovery increment has a bigger effect in increasing accuracy than what could be achieved by increasing the number of points on the SRCs.

QSRC Method—Effect of $T_1$ Differences

The QSRC method utilizes the differences in the shapes of reference and mixture SRCs to quantify the components in the mixtures. Smaller differences in the $T_1$ relaxation times of the components will lead to correspondingly smaller differences in SRCs and at the limit of equal relaxation times, the QSRC approach will fail. In order to estimate the impact of the $T_1$ differences on the validity of the QSRC method, a model system with components possessing significantly more similar $^1$H $T_1$ relaxation times than the ibuprofen/indomethacin model system was analyzed. Ibuprofen and itraconazole have $^1$H $T_1$ relaxation times of approximately 626 ms and 720 ms, respectively (estimated from mono-exponential fits of saturation recovery data), hence the $T_1$s only differ by about 13%. A series of seven binary blends of ibuprofen and itraconazole with varying mass percentages of ibuprofen were prepared and analyzed with the QSRC method. The blend compositions are given above in Table 2.

Figure 9:
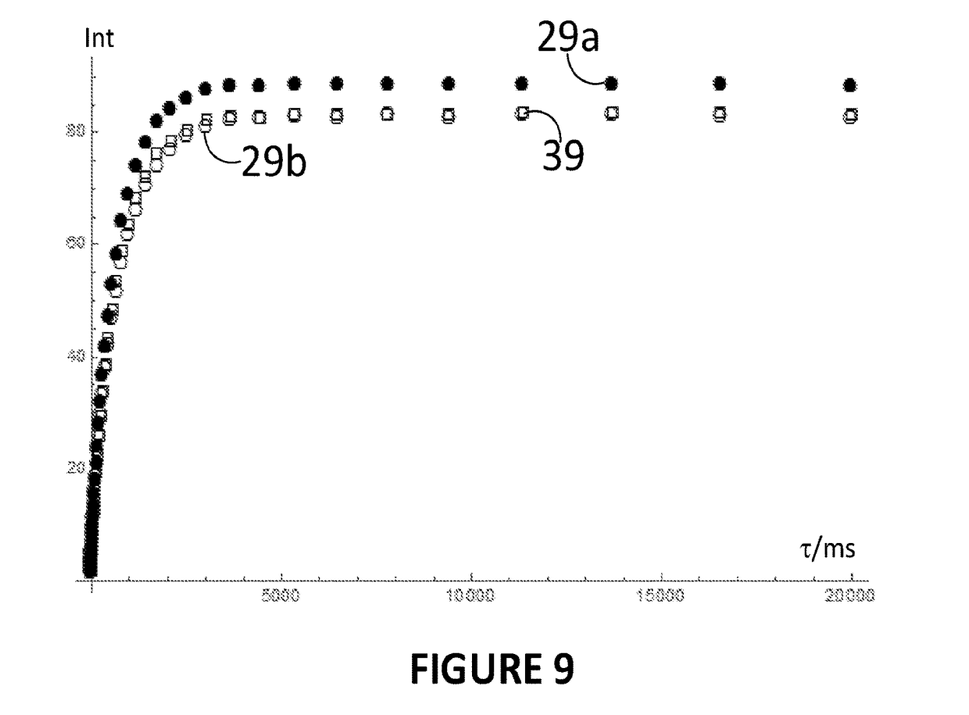
FIG. 9 is a graph illustrating saturation recovery curves of two model components with similar relaxation times and a mixture thereof.

If SRCs of two different compounds are very close, the QSRC method is still capable of differentiating these compounds; however, the number of scans per increment should be high enough, as discussed below. FIG. 9 shows the raw $^1$H reference SRCs for ibuprofen (filled round points 29a) and itraconazole (unfilled round points 29b), as well as the raw $^1$H SRC for the ibuprofen/itraconazole blend containing 50.0% ibuprofen (blend Bl-1 from Table 2, square points 39). The SRCs for the two references and the blend were collected with 128 scans per recovery increment, 50 logarithmically distributed recovery time points, and covering a total delay range from 2-20000 ms. It is evident from FIG. 9 that the differences between the SRCs of ibuprofen and itraconazole (29a, 29b) are small. The QSRC analysis on the seven blends was completed utilizing reference and blend SRCs collected with a varying number of scans per recovery increment and number of recovery points. Table 7 lists the different conditions and shows the correlation parameters produced by the QSRC fits.

TABLE 7

$^1$H QSRC results for the ibuprofen/itraconazole blends utilizing SRCs collected with different experimental conditions.

| Condition Name | Number of scans | Number of points | Exp time | R2 | slope | intercept |
|---|---|---|---|---|---|---|
| 4sc_50p | 4 | 50 | | 0.8836 | 0.774 | 24.8 |
| 32sc_50p | 32 | 50 | | 0.9868 | 0.928 | 1.905 |
| 64sc_50p | 64 | 50 | | 0.9716 | 0.927 | −3.27 |
| 128sc_50p | 128 | 50 | | 0.9968 | 1.011 | 0.066 |
| 64sc_30p | 64 | 30 | | 0.9913 | 1.027 | −0.047 |

When only four scans per recovery increment are collected, the QSRC analysis fails. Increasing the number of scans per increment to 32 and 64 significantly improves the accuracy of the analysis and prepared blend compositions are reproduced within approximately 5%. Finally, utilizing 128 scans per increment yields a very good correlation, comparable to the one observed for the ibuprofen/indomethacin system. The results for the ibuprofen/itraconazole model system from Table 7 show that a notably higher SNR of the SRCs is required to achieve the same accuracy in the QSRC analysis as compared to the ibuprofen/indomethacin system. This is due to the similar $^1$H $T_1$ relaxation times of ibuprofen and itraconazole.

QSRC Method—Application to $^{19}$F SRCs

In order to explore the applicability of the QSRC method to $^{19}$F SRCs, two model systems containing $^{19}$F were analyzed. The systems are 2-trifluoromethyl cinnamic acid/6-trifluoromethyl uracil (2TFMCA/6TFMU) and 2-trifluoromethyl cinnamic acid/fluoxetine HCl (2TFMCA/FXT). The 2TFMCA/6TFMU model system represents the situation in which the $T_1$ relaxation times of the references differ significantly (slightly more than a factor of two). On the other hand, for the 2TFMCA/FXT model system the reference $^{19}$F $T_1$s only differ by about 12%. Several binary blends of the two $^{19}$F model systems were prepared and analyzed with the QSRC method. Tables 3 and 4 list the compositions of the blends. The SRCs for the both model systems were collected with fifty logarithmically distributed recovery time points and covering a total delay range from 2-40000 ms. However, the SRCs for the 2TFMCA/6TFMU and the 2TFMCA/FXT model systems were collected with 32 and 128 scans per recovery experiment, respectively.

Figure 10A:
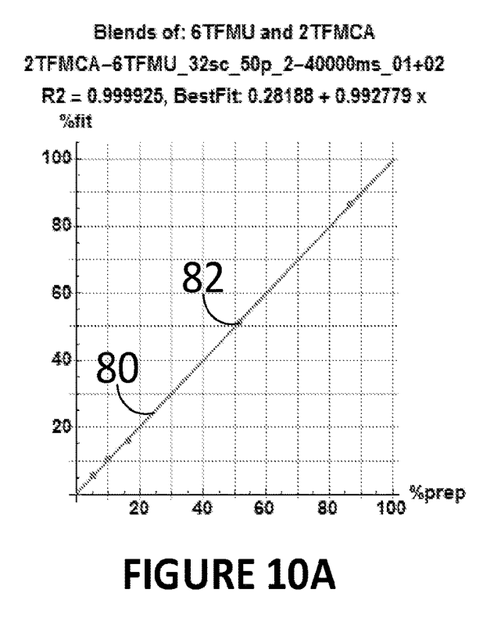
FIGS. 10A-10B are graphs illustrating the correlations between the concentrations in mixtures of two fluorine-containing model compounds, as obtained using the method of the invention versus the actual concentration thereof in the mixtures. Correlations are shown for two experimental conditions that differ in the number of scans and time duration of acquisition.
Figure 10B:
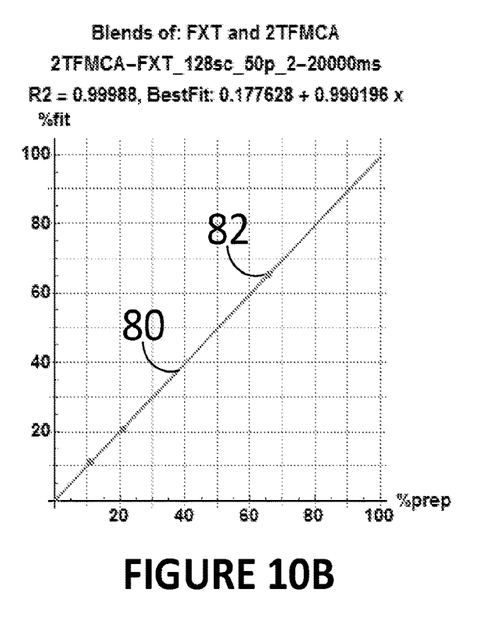

FIGS. 10A-10B show the plots of the mass percentages obtained from the QSRC method (x-axis of the graph) versus the prepared mass percentages (y-axis of the graph) for all blends of the 2TFMCA/6TFMU and 2TFMCA/FXT model systems. Together, the points of all blend concentrations make up plots 82. The fit with the regression lines 80 (i.e., high correlation) demonstrates the predictability of the QSRC method with regard to mixture concentration determination using $^{19}$F SRCs. The corresponding correlation parameters obtained from the fits are listed in the captions in FIGS. 10A-10B. From the data it is evident that the blend compositions are reproduced very accurately by the QSRC analyses. As expected, a significantly higher SNR is necessary to quantify the components in the 2TFMCA/FXT blends as compared to the 2TFMCA/6TFMU blends, since the $^{19}$F $T_1$s of the components differ by only about 12% in the 2TFMCA/FXT blends.

In general, the experiment times to collect the $^{19}$F SRCs with sufficient SNR for QSRC analysis are longer than the corresponding experiment times necessary utilizing $^1$H SRCs. The signal intensity that is acquired per scan will drop by going from observing $^1$H to observing $^{19}$F simply based on the fact that there are generally a lot fewer fluorine atoms present in a given molecule than hydrogen atoms. In fact, the $^{19}$F model system compounds used in this study only contain one fluorine atom each.

The QSRC analysis could be applied to nuclei other than $^1$H and $^{19}$F. For example, mineral or soil samples analysis could benefit from conducting the QSRC analysis based on $^{13}$C and $^{31}$P SRCs. Other NMR-active nuclei, such as $^{35}$Cl, may also be used.

The QSRC method described above reliably determines coefficients that represent the relative mass percentages of components in a solid mixture. The method is advantageous in various ways. Firstly, the method takes advantage of the high sensitivity of observing protons or fluorine directly. In addition, it utilizes the time-efficient way of collecting high-quality relaxation data on a low-field TD-NMR benchtop instrument. In the TD NMR approach, the collection of a complete FID and subsequent Fourier Transformation are omitted, rather only the first few points of the FID are collected and averaged to produce the intensity of a recovery point in a relaxation experiment. The resulting intensity can subsequently be used to measure NMR relaxation of the bulk of the material. The utilization of TD-NMR benchtop instruments is beneficial with respect to other aspects as well. These instruments exhibit a small footprint and can easily be placed directly on lab benchtops without any special electrical and safety requirements. TD-NMR spectrometers also do not require cryogenic cooling. This enables the use of TD-NMR instruments in very diverse laboratory environments, such as industrial production sites. Finally, the simplicity of the sample preparation for analysis in a TD NMR benchtop instrument as well as the option for automation cannot be overstated. These final benefits are especially important in high-throughput environments like the pharmaceutical industry or the production of fine chemicals.

The described analysis of SRC data may be used to quantify the drug loading of a given API in a pharmaceutical formulation. A formulation is a mixture of the desired and potentially undesired API forms, along with a specific combination of pharmaceutical excipients. To obtain the drug loading, the excipients are treated as one pure component, even though more than one excipient may be present in the formulation, and the API forms (including polymorphs, solvates and hydrates of each API) are treated as the remaining components. Quantifying API forms is relevant if there are at least two forms present in the sample (e.g., various polymorphs, solvate and non-solvate, etc.). The drug-loading analysis requires the collection of one SRC of a blend of excipients with the respective concentrations as present in the actual formulation (placebo SRC). The proton number and molecular mass of the excipients is weighted according to the relative mass percentages of the excipients. The qSRC analysis can then be conducted as proposed above.

An example would be a hypothetical formulation containing two excipients A and B with a relative molar ratio of the two excipients of 20% A and 80% B. Assuming further that excipient A has a molecular mass of 100 and a proton number 6, and excipient B has a molecular mass of 200 and a proton number 10, the weighted average molecular mass for the excipients would be 20+160=180, and the corresponding weighted proton number would be 1.2+8=9.2. An SRC of an excipient placebo blend of 20% A and 80% B by mole would be collected and treated in the qSRC analysis as one pure excipient component with a molecular mass of 180 and proton number 9.2. The respective qSRC fitting result would yield weighting coefficients representing the individual mass percentages for each API form (polymorph, hydrate, solvate) and for each API, but only one mass percentage for the combined excipients. The ratio of API to excipient concentrations would reveal the drug loading of the formulation.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A method of determining the relative quantities of a plurality of expected components in a sample using a time-domain nuclear magnetic resonance (TD-NMR) spectrometer, the method comprising:
    a) obtaining a component saturation recovery curve (SRC) for each of the components;
    b) measuring the sample using a TD-NMR spectrometer and obtaining a mixture saturation recovery curve ($SRC_{mix}$) therefrom; and
    c) fitting to the $SRC_{mix}$ a linear combination of the component SRCs, each scaled by a weighting coefficient, the respective weighting coefficients being indicative of the relative quantities of the plurality of expected components in the sample.

2. The method of claim 1 wherein obtaining a component saturation recovery curve (SRC) for each of the components comprises measuring the component using the TD-NMR spectrometer.

3. The method of claim 1, wherein fitting to the $SRC_{mix}$ a linear combination of the component SRCs comprises identifying the weighting coefficients that minimize a representative value of a difference vector between the $SRC_{mix}$ and the linear combination of the component SRCs.

4. The method of claim 3, wherein minimizing the representative value of the difference vector comprises minimizing the variance between the $SRC_{mix}$ and the linear combination of the component SRCs.

5. The method of claim 1, wherein fitting to the $SRC_{mix}$ a linear combination of the component SRCs comprises normalizing the $SRC_{mix}$ and the component SRCs.

6. The method of claim 5, wherein the normalizing reflects operational parameters of the TD-NMR spectrometer.

7. The method of claim 5, wherein the normalizing reflects a molecular weight and/or a number of protons of each sample component.

8. The method of claim 3, wherein identifying the weighting coefficients comprises minimizing a representative value of $$SRC_{mix} - \left(\sum_{i=1}^{N} c_i^{norm} SRC_i^{norm} + b^{norm}\right),$$

wherein each $c_i^{norm}$ is a weighting coefficient to be identified for a component i, each $SRC_i^{norm}$ is a normalized SRC for a component i, and $b^{norm}$ is an arbitrary offset to be identified together with the weighting coefficients.

9. The method of claim 1, wherein obtaining a component saturation recovery curve (SRC) comprises obtaining one of a $^1H$, a $^{13}C$, a $^{19}F$ and a $^{31}P$ $T_i$ saturation recovery curve, and obtaining a mixture saturation recovery curve ($SRC_{mix}$) comprises obtaining the one of a $^1H$, a $^{13}C$, a $^{19}F$ and a $^{31}P$ $T_i$ saturation recovery curve.

10. The method of claim 1, wherein obtaining a component SRC for each of the components comprises obtaining an SRC for at least one active pharmaceutical ingredient and at least one excipient component of a pharmaceutical formulation.

11. The method of claim 1, wherein obtaining a component SRC for each of the components comprises obtaining an SRC for at least two polymorphs, solvates or hydrates of a compound.

* * * * *